United States Patent
Nam

(10) Patent No.: US 10,777,767 B2
(45) Date of Patent: Sep. 15, 2020

(54) ARRAY CELL UNIT, METHOD OF MANUFACTURING THE SAME AND LIGHT EMITTING DIODE DISPLAY DEVICE INCLUDING THE SAME

(71) Applicant: DB HITEK CO., LTD., Seoul (KR)

(72) Inventor: Sang Woo Nam, Cheongju-si (KR)

(73) Assignee: DB HITEK CO., LTD., Seoul (KR)

( * ) Notice: Subject to any disclaimer, the term of this patent is extended or adjusted under 35 U.S.C. 154(b) by 87 days.

(21) Appl. No.: 16/216,234

(22) Filed: Dec. 11, 2018

(65) Prior Publication Data
US 2019/0181371 A1    Jun. 13, 2019

(30) Foreign Application Priority Data
Dec. 11, 2017 (KR) .................. 10-2017-0169241

(51) Int. Cl.
| | | |
|---|---|---|
| H01L 51/52 | (2006.01) | |
| H01L 27/32 | (2006.01) | |
| H01L 51/56 | (2006.01) | |
| H01L 51/00 | (2006.01) | |

(52) U.S. Cl.
CPC ...... H01L 51/5209 (2013.01); H01L 27/3244 (2013.01); H01L 51/0023 (2013.01); H01L 51/5218 (2013.01); H01L 51/56 (2013.01); H01L 2227/323 (2013.01); H01L 2251/301 (2013.01)

(58) Field of Classification Search
CPC ............ H02L 51/5209; H02L 27/3244; H02L 51/5218; H02L 2251/301; H02L 51/0023; H02L 2227/323; H02L 51/56
See application file for complete search history.

(56) References Cited

FOREIGN PATENT DOCUMENTS

KR    10-0791011    12/2007

OTHER PUBLICATIONS

Application and Filing Receipt for U.S. Appl. No. 16/136,468, filed Sep. 20, 2018, Inventor(s): Hyo Jung et al.
Application and Filing Receipt for U.S. Appl. No. 16/216,241, filed Dec. 11, 2018, Inventor(s): Woo Nam et al.

*Primary Examiner* — Joseph L Williams
(74) *Attorney, Agent, or Firm* — Patterson Thuente Pedersen, P.A.

(57) ABSTRACT

An anode cell array unit for an organic light emitting diode display. The anode cell array unit is disposed on a substrate structure unit including an active element for each pixel, and has an organic light emitting unit is disposed thereon. The anode cell array unit may include an insulating interlayer disposed on the substrate structure unit, and configured to be isolated from the active element, an anode structure disposed on the insulating interlayer, and electrically connected to the active element, an anode cell isolator being arranged to penetrate through the anode structure and to protrude upward from the anode structure, and being configured to define a plurality of cells by isolating the pixels from each other, and a leakage current suppressing layer pattern disposed on the anode structure to surround a sidewall of the anode cell isolator to be configured to suppress a leakage current that occurs in an area adjacent to an interface between the anode cell isolator and the anode structure

15 Claims, 6 Drawing Sheets

ARRAY CELL UNIT, METHOD OF MANUFACTURING THE SAME AND LIGHT EMITTING DIODE DISPLAY DEVICE INCLUDING THE SAME

CROSS-REFERENCE TO RELATED APPLICATION

This application claims priority to Korean Patent Application No. 10-2017-0169241, filed on Dec. 11, 2017 and all the benefits accruing therefrom under 35 U.S.C. § 119, the contents of which are incorporated by reference in their entirety.

TECHNICAL FIELD

The present disclosure relates to an array cell unit, a method of manufacturing the same, and a light emitting diode display device including the same, and more particularly, to an array cell unit having a plurality of divided cells, a method of manufacturing the array cell unit and, an organic light emitting diode display device including the array cell unit.

BACKGROUND

Flat panel display devices such as plasma display panels (PDP), liquid crystal display (LCD) devices, and organic light emitting diode (OLED) display devices have been widely studied and utilized.

OLED display devices are spontaneous light emitting devices. OLED display devices may therefore be downsized and lightened relative to LCD devices because an OLED display device may not require a backlight unit which has been normally implemented into LCD devices.

Further, OLED display devices have a better viewing angle and contrast ratio than LCD devices using liquid crystals. Furthermore, OLED display devices may have advantages in terms of power consumption, and can be driven by a relatively low DC voltage and with a quick response speed. OLED display devices may be resistant to external impact and can have a wide driving temperature range. In particular, since the manufacturing process is simple, there is an advantage that the production costs can be saved more than through the use of conventional LCD devices.

Organic light emitting diode display devices can include a signal control unit for controlling a signal for each pixel, an organic light emitting unit for generating light for each pixel using an organic material according to the signal, and an anode cell array unit being interposed between the signal control unit and the organic light emitting unit to define each of cells by isolating each pixel. The anode cell array unit can include an anode structure.

An anode cell array unit may include an anode cell isolator which isolates the pixel from each other to define the cells. The anode cell isolator may be formed by filling a trench penetrating through the anode structure with an insulating material. In these conventional embodiments, a leakage current may be generated in a corner region between the anode cell isolator and the anode structure due to the concentration of the electric field.

SUMMARY

The example embodiments of the present disclosure provide an anode cell array unit capable of suppressing leakage current that may occur in a corner region between an anode cell isolator and an anode structure.

The example embodiments of the present disclosure provide a method of manufacturing the anode cell array unit capable of suppressing leakage current that may occur in a corner region between an anode cell isolator and an anode structure.

The example embodiments of the present disclosure provide an organic light emitting diode display device including the anode cell array unit capable of suppressing a leakage current that may occur in a corner region between an anode cell isolator and an anode structure.

In an example embodiment, an anode cell array unit for an organic light emitting diode display is disposed on a substrate structure unit including an active element for each pixel, and has an organic light emitting unit is disposed thereon, the anode cell array unit may include an insulating interlayer disposed on the substrate structure unit, and configured to be isolated from the active element, an anode structure disposed on the insulating interlayer, and electrically connected to the active element, an anode cell isolator being arranged to penetrate through the anode structure and to protrude upward from the anode structure, and being configured to define a plurality of cells by isolating the pixels from each other, and a leakage current suppressing layer pattern disposed on the anode structure to surround a sidewall of the anode cell isolator to be configured to suppress a leakage current that occurs in an area adjacent to an interface between the anode cell isolator and the anode structure.

In an example embodiment, the leakage current suppressing layer pattern may be configured to make contact with an upper sidewall of the anode cell isolator and a top surface of the anode structure.

In an example embodiment, the anode cell isolator and the leakage current suppressing layer pattern may define a T-shaped cross section, such that the anode cell isolator and the leakage current suppressing layer pattern has a T-shape as a whole, when viewed in section.

In an example embodiment, the leakage current suppressing layer pattern may include silicon oxide.

In an example embodiment, the anode structure may include a first metal layer pattern disposed on the insulating interlayer, and configured to reflect light generated from the organic light emitting unit, and a second metal layer pattern disposed on the first metal layer pattern, and being compressing a metal having a work function of equal to or greater than about 4.0 eV. The first metal layer pattern may include aluminum-copper alloy, and the second metal layer pattern may include cobalt nitride or titanium nitride.

According to an example embodiment of a method of manufacturing an anode cell array unit for an organic light emitting diode display device comprises forming a substrate structure including an active element for each pixel of a plurality of pixels, forming an insulating interlayer on the substrate structure, the insulating interlayer being insulated from the active element, forming a preliminary anode structure on the insulating interlayer, the preliminary anode structure being configured to be electrically connected to the active element of each pixel of the plurality of pixels. The method further comprises, for each pixel of the plurality of pixels, forming an anode cell isolator penetrating the preliminary anode structure to protrude upwardly from the preliminary anode structure and being configured to isolate the pixel from the others of the plurality of pixels, transforming the preliminary anode structure into an anode structure, and forming a leakage current suppressing layer pattern on the anode structure to cover a sidewall of each anode cell isolator such that a leakage current toward the anode cell isolator is suppressed.

In an example embodiment, forming the preliminary anode structure may include forming a first metal layer on the insulating interlayer for reflecting light generated from the organic light emitting unit, and forming a second metal layer on the first metal layer, the second metal layer being made of a metal having a work function of about 4.0 eV or more.

In an example embodiment, transforming the preliminary anode structure into the anode structure may include forming a leakage current suppressing layer on the second metal layer, forming a polishing stopper layer on the leakage current suppressing layer, patterning the polishing stopper layer, the leakage current suppressing layer, and the first and second metal layers to forming a cell isolation trench, and filling the cell isolation trench with an insulating material to form an anode cell isolator.

Further, the leakage current suppressing layer may be formed using silicon oxide, and the polishing stopper layer may be formed using silicon nitride.

In an example embodiment, removing residue remaining on the polishing stopper layer through a polishing process using the polishing stopper layer as a polishing stopper may be further performed, after forming the polishing stopper layer.

According to an example embodiment, an organic light emitting diode display includes a substrate structure unit including a substrate and an active element for each of a plurality of pixels disposed on the substrate, an anode cell array unit disposed on the substrate structure, the anode cell array unit including an insulating interlayer disposed on the substrate structure unit and insulated from the active elements, an anode structure disposed on the insulating interlayer and electrically connected to the active elements, an anode cell isolator for each of the plurality of pixels being arranged to penetrate through the anode structure and to protrude upward from the anode structure, and being configured to define a plurality of cells by isolating the pixels from each other, and a leakage current suppressing layer pattern disposed on the anode structure to surround a sidewall of the anode cell isolator configured to suppress a leakage current that occurs in an area adjacent to an interface between the anode cell isolator and the anode structure, and an organic light emitting unit disposed on the anode cell array unit and emitting light according to a signal of the signal control unit.

In an example embodiment, the leakage current suppressing layer pattern may be configured to make contact with an upper sidewall of the anode cell isolator and a top surface of the anode structure.

In an example embodiment, the anode cell isolator and the leakage current suppressing layer pattern may define a T-shaped cross section.

In an example embodiment, the leakage current suppression layer pattern may include silicon oxide.

According to some embodiments of the present disclosure, it is possible to suppress leakage currents around the interface region between the anode cell array isolator and the anode structure from occurring as a result of the electric field concentration suppressing layer pattern which is provided in the interface region.

Further, because the leakage current suppressing layer pattern and the anode structure have the T-shape as a whole, the reflection characteristics of the first metal layer pattern included in the anode structure may be effectively secured.

On the other hand, by providing the polishing stopper layer on the leakage current suppressing layer, the anode cell isolator may keep a thickness thereof uniform while performing the polishing process using the polishing stopper layer.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Example embodiments can be understood in more detail from the following description taken in conjunction with the accompanying drawings, in which.

Figure 1:
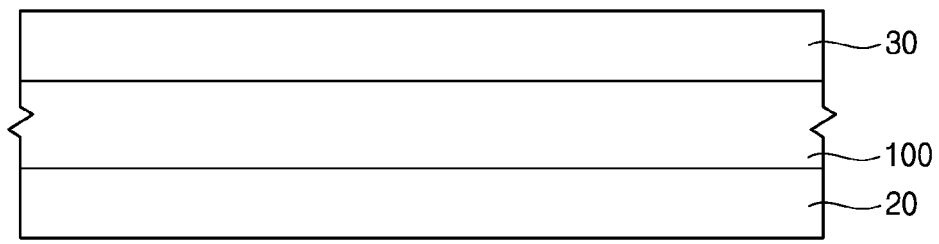
FIG. 1 is a cross sectional view illustrating an organic light emitting diode (OLED) display device including an anode cell array unit of an organic light emitting diode (OLED) display device in accordance with an example embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, specific embodiments will be described in more detail with reference to the accompanying drawings. The present disclosure may, however, be embodied in different forms and should not be construed as limited to the embodiments set forth herein.

As an explicit definition used in this application, when a layer, a layer, a region or a plate is referred to as being 'on' another one, it can be directly on the other one, or one or more intervening layers, layers, regions or plates may also be present. In contrast, it will also be understood that when a layer, a layer, a region or a plate is referred to as being 'directly on' another one, it is directly on the other one, and one or more intervening layers, layers, regions or plates do not exist. Also, though terms like a first, a second, and a third are used to describe various components, compositions, regions and layers in various embodiments of the present disclosure are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present disclosure. Unless otherwise defined herein, all the terms used herein, which include technical or scientific terms, may have the same meaning that is generally understood by those skilled in the art.

The depicted embodiments are described with reference to schematic diagrams of some embodiments of the present disclosure. Accordingly, changes in the shapes of the diagrams, for example, changes in manufacturing techniques and/or allowable errors, are sufficiently expected. Accordingly, embodiments of the present disclosure are not described as being limited to specific shapes of areas described with diagrams and include deviations in the shapes and also the areas described with drawings are entirely schematic and their shapes do not represent accurate shapes and also do not limit the scope of the present disclosure.

Figure 2:
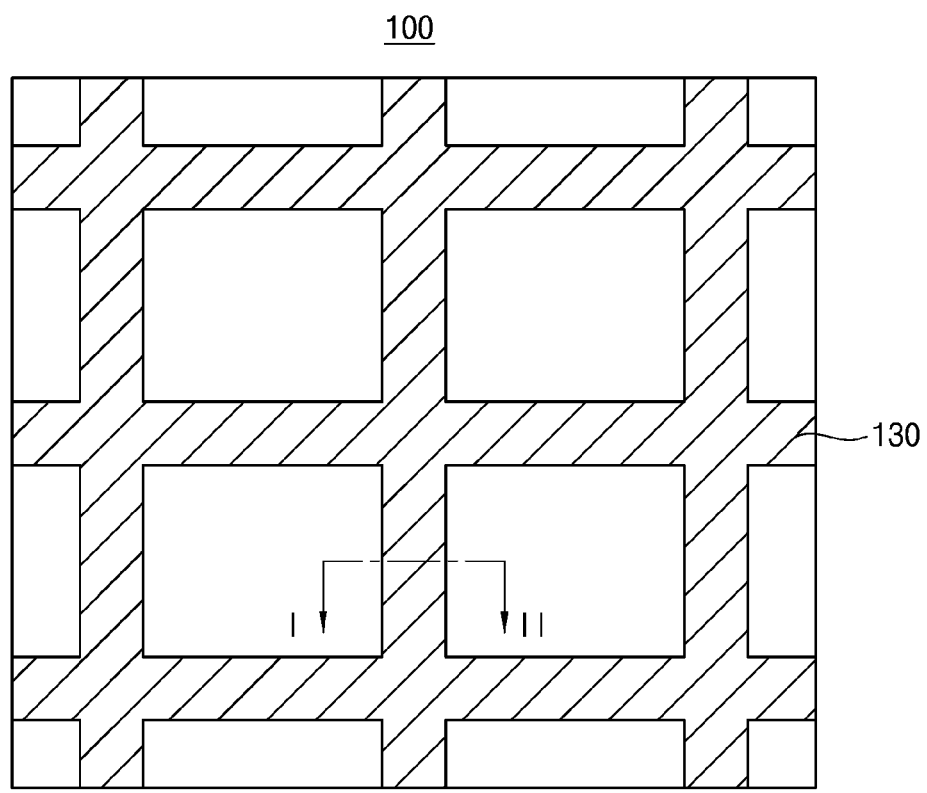
FIG. 2 is a plan view illustrating the anode cell array unit of FIG. 1.
Figure 3:
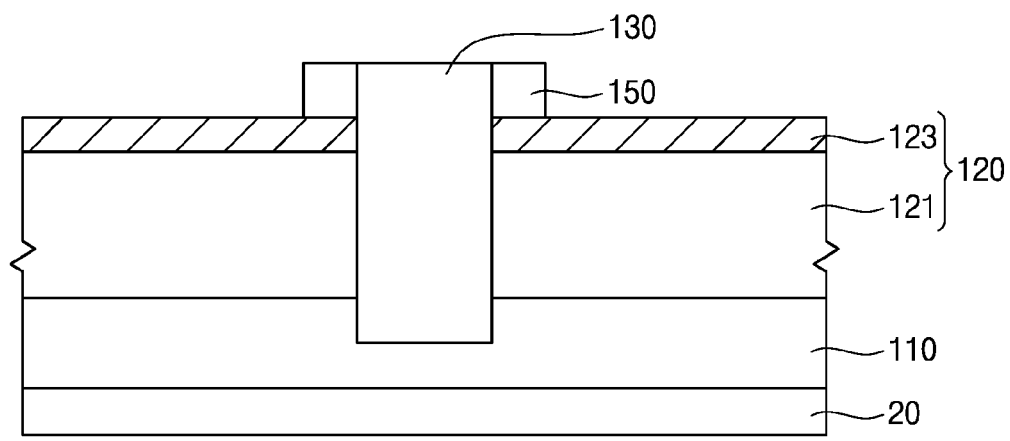
FIG. 3 is a cross sectional view taken along a line I-II in FIG. 2.

FIG. 1 is a cross sectional view illustrating an organic light emitting diode (OLED) display device including an anode cell array unit 100 in accordance with an example embodiment of the present disclosure. FIG. 2 is a plan view illustrating the anode cell array unit 100 of FIG. 1. FIG. 3 is a cross-sectional view taken along a line I-II in FIG. 2.

As depicted in FIGS. 1 to 3, an anode cell array unit 100 according to an example embodiment of the present disclosure includes an insulating interlayer 110, an anode structure 120, an anode cell isolator 130, and a leakage current suppressing layer pattern 150. The anode cell array unit 100 may be disposed on a substrate structure unit 20 including an active element (not shown) for each pixel. Further, an organic light emitting unit 30 may be disposed on the anode cell array unit 100. That is, the anode cell array unit 100 may be interposed between the substrate structure unit 20 and the organic light emitting unit 30. The anode cell array unit 100 may control light emitting diodes for each cell by applying a control signal generated from the substrate structure unit 20 to the light emitting diodes included in the organic light emitting unit 30. In embodiments, the active element may comprise a diode, a transistor, or the like.

That is, the substrate structure unit 20 may include an active element having a substrate and a gate insulating layer, an active region, a source region, and a drain region.

Further, the active element may include an erasable programmable read only memory (EPROM) capable of erasing data by irradiating ultraviolet rays, and an electrically erasable programmable read only memory (EEPROM) capable of erasing data using electricity instead of ultraviolet light.

The insulating interlayer 110 is disposed on the substrate structure unit 20. The insulating interlayer 110 electrically isolates the substrate structure unit 20 and the anode structure 120 from each other. Meanwhile, for example, the insulating interlayer 110 is formed of silicon oxide or silicon oxynitride. The insulating interlayer 110 may have a uniform thickness.

The anode structure 120 is formed on the insulating interlayer 110. The anode structure 120 is electrically connected to the active element included in the substrate structure unit 20.

Accordingly, the anode structure 120 may drive a light emitting diode (not shown) included in the organic light emitting unit 30 by utilizing the electric signal generated by the active element. In addition, the anode structure 120 may control driving of the light emitting diode along with a cathode structure (not shown) included in the organic light emitting unit 30. In the anode structure of anode cell array unit 100, a trench penetrating in the vertical direction may be formed.

The anode cell isolator 130 is provided to penetrate through the anode structure 120. That is, the anode cell isolator 130 may vertically penetrate through the anode structure 120 to define a plurality of cells corresponding to the pixels of the anode structure 120 as a whole.

As can be seen in FIG. 2, the anode cell isolator 130 has a matrix structure when seen in a plan view in embodiments. Accordingly, the anode structure 120 adjacent to the anode cell isolator 130 may be divided into a plurality of cells. In other embodiments, the anode cell isolator 130 may have a stripe, or other shape.

The anode cell isolator 130 protrudes upward from the anode structure 120. That is, the anode cell isolator 130 may protrude from an upper surface of the anode structure 120 to have a protruded portion of the anode cell isolator 130.

The anode cell isolator 130 may be formed through a device isolation process such as a shallow trench isolation process. That is, the anode cell isolator 130 may be formed by filling the trench formed in the anode structure 120 with an insulating material.

The leakage current suppressing layer pattern 150 is disposed on the anode structure 120. The leakage current suppressing layer pattern 150 is provided to surround a sidewall of the anode cell isolator 130. That is, the leakage current suppressing layer pattern 150 may be formed to surround the side wall of the protruded portion of the anode cell isolator 130. For example, when the anode cell isolator 130 has a stripe shape, the leakage current suppression layer pattern 150 may extend along both sidewalls of the anode cell isolator 130. The leakage current suppressing layer pattern 150 may include silicon oxide or silicon oxynitride.

The leakage current suppressing layer pattern 150 may suppress electric field from concentrating near an interface region which is defined by an interface region adjacent to an interface between the anode cell isolator 130 and the anode structure 120. Thus, a leakage current, which may be generated by the electric field concentration in the interface region, may be suppressed owing to the leakage current suppressing layer pattern 150.

The leakage current suppressing layer pattern 150 may be provided to cover an upper sidewall of the anode cell isolator 130 and a portion of an upper surface of the anode structure 120. In this case, the leakage current suppressing layer pattern 150 may entirely cover the interface region adjacent to the interface between the anode cell isolator 130 and the anode structure 120. As a result, the leakage current suppressing layer pattern 150 may more effectively suppress the leakage current which may be generated in the interface region.

In one embodiment of the present disclosure, both the anode cell isolator 130 and the leakage current suppressing layer pattern 150 may have a T-shape as a whole, when viewed in a vertical section, such as depicted in FIG. 3. Accordingly, when the anode structure 120 includes a metal layer pattern for light reflection, the anode structure 120 may have relatively high reflection efficiency.

In one embodiment of the present disclosure, the anode structure 120 includes a first metal layer pattern 121 and a second metal layer pattern 123. That is, the anode structure 120 may have a multi-layered metal structure.

The first metal layer pattern 121 is formed on the insulating interlayer 110. The first metal layer pattern 121 may upwardly reflect light emitted from the organic light emitting unit 30 disposed on the first metal layer pattern 121. Thus, the luminance of the organic light emitting unit 30 may be increased. In addition, the first metal layer pattern 121 may be formed of a metal material having a relatively high reflectivity. In embodiments, the first metal layer pattern 121 may be formed of aluminum, copper, or an alloy thereof.

The second metal layer pattern 123 is formed on the first metal layer pattern 121. The second metal layer pattern 123 may be formed of a metal having a work function of 4.0 eV or more. For example, the second metal layer pattern 123 may be made of tungsten. Alternatively, the second metal layer pattern 123 may include cobalt nitride or titanium nitride. Thus, the anode structure 120 having the second metal layer pattern 123 requires relatively high photon energy for photoelectron emission. As a result, the anode structure 120 having the second metal layer pattern 123 may effectively provide emission control functionality to the organic light emitting unit 30.

FIGS. 4, 6 to 9 are cross sectional views illustrating a method of manufacturing an array cell unit in accordance with an example embodiment of the present disclosure. FIG. 5 is a plan view illustrating a step of preparing for a substrate structure unit.

Figure 4:
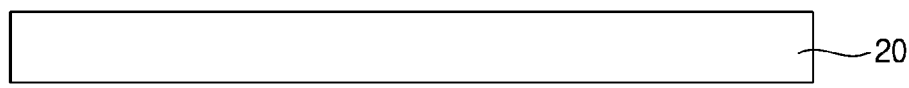
FIGS. 4, and 6 through 9 are cross sectional views illustrating a method of manufacturing an array cell unit in accordance with an example embodiment of the present disclosure.
Figure 5:
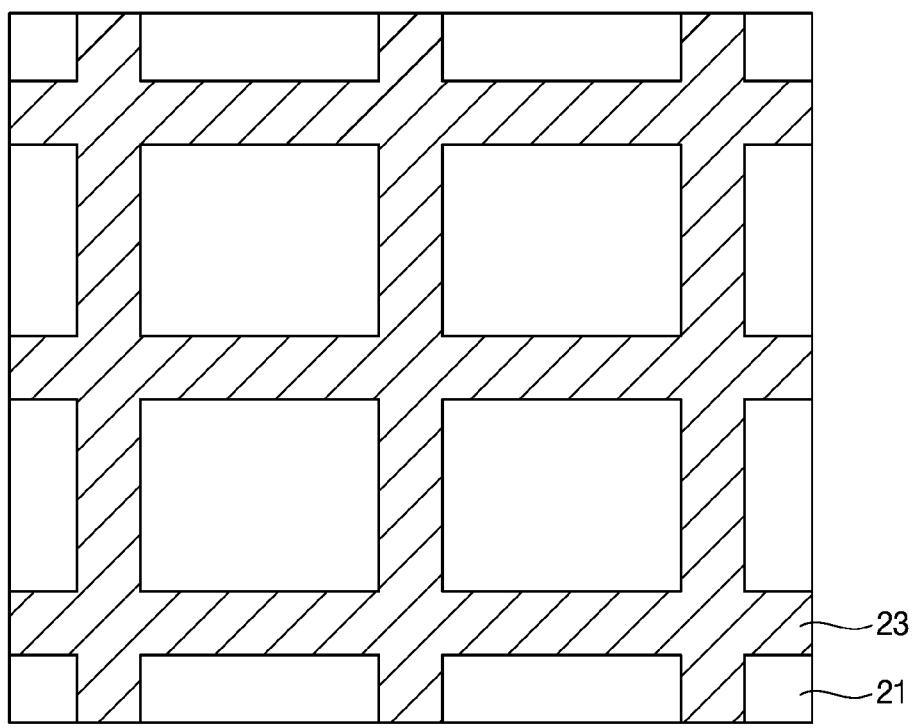
FIG. 5 is a plan view illustrating a step of preparing for a substrate structure unit.

Referring to FIGS. 4 and 5, according to a method of manufacturing an anode cell array unit in accordance with an embodiment of the present disclosure, a substrate structure unit 20 including an active element for each of pixels is prepared.

The substrate structure unit 20 may be prepared by forming the active element (not shown) on the substrate for each of the pixels 21. In the embodiment depicted in FIG. 5, a pixel separation layer pattern 23 for partitioning a plurality of the pixels 21 is provided to make a matrix form.

In embodiments, the active element includes comprises a diode or a transistor. Further, the active element may include an erasable programmable read only memory (EPROM) capable of erasing data by irradiating ultraviolet rays, and an electrically erasable programmable read only memory (EEPROM) capable of erasing data using electricity instead of ultraviolet light. The active element may control a signal using a floating gate. Further, charges may be charged or erased in the floating gate, so that the data may be removed.

Figure 6:
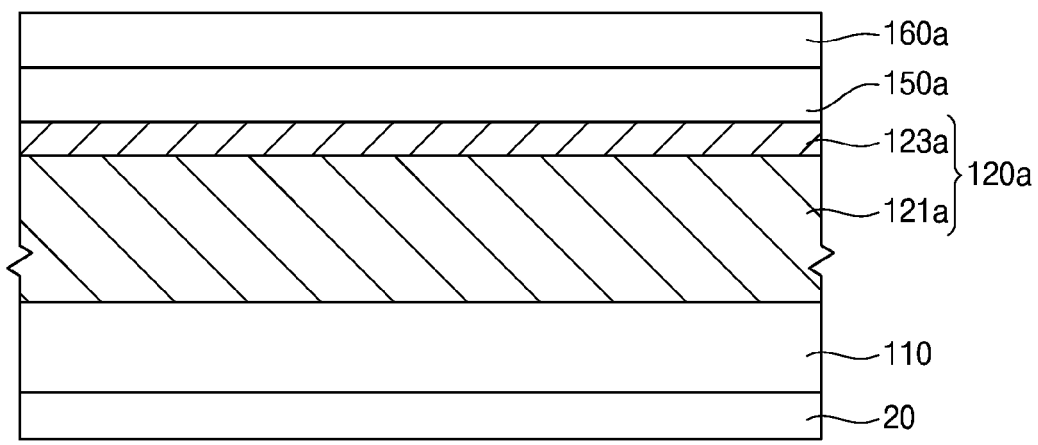

Referring to FIG. 6, an insulating interlayer 110 for isolating an above-positioned layer from the active element is formed on the substrate structure unit 20. The insulating interlayer 110 may be formed through a plasma enhanced chemical vapor deposition (PE-CVD) process. The insulating interlayer 110 may be formed using silicon oxide.

Next, a preliminary anode structure 120a, electrically connected to the active element, is formed on the insulating interlayer 110.

In an embodiment, the preliminary anode structure 120a is formed to include a plurality of stacked metal layers. That is, a first metal layer 121a is formed on the insulating interlayer 110 to reflect light generated from the organic light emitting unit 30 (see FIG. 1). A second metal layer 123a is further formed on the first metal layer 121a. The second metal layer 123a may be made of a metal having a work function of 4.0 eV or more on the first metal layer 121a.

Figure 7:
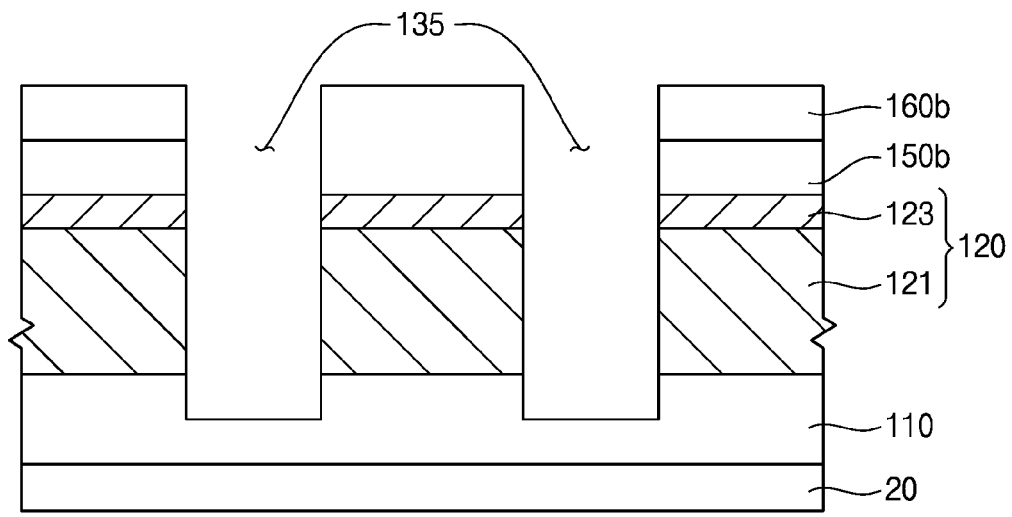
Figure 8:
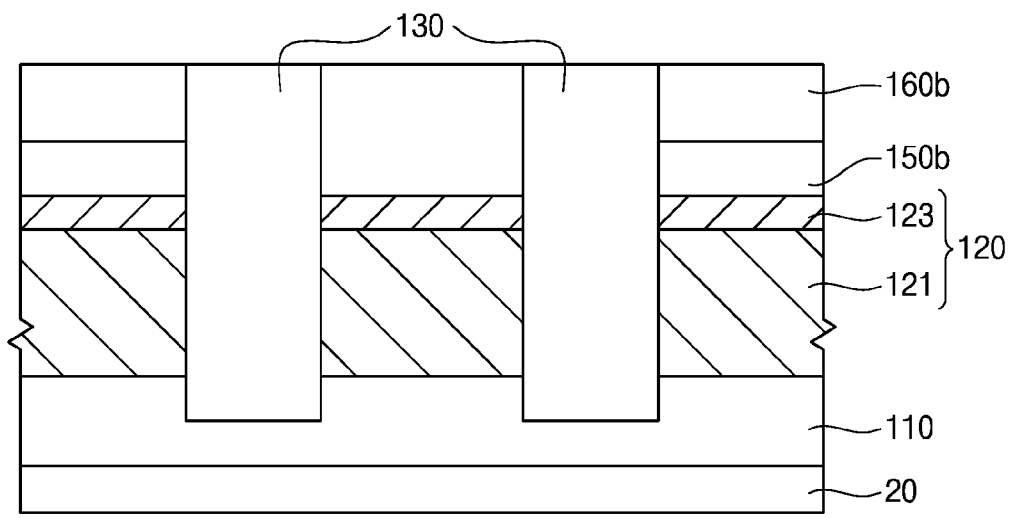

Referring to FIGS. 6, 7 and 8, an anode cell isolator 130, which defines each of cells by isolating the pixels from each other, is formed (see FIG. 8). The anode cell isolator 130 may penetrate through the preliminary anode structure 120a and protrude upward from the preliminary anode structure 120a. Further, the preliminary anode structure 120a may be transformed into an anode structure 120 while forming the anode cell isolator 130.

In an embodiment of the present disclosure, referring to FIG. 6, a leakage current suppressing layer 150a is formed on the second metal layer 123a for the anode cell isolator 130 (see FIG. 8). The leakage current suppressing layer 150a may be formed through a chemical vapor deposition process. The leakage current suppressing layer 150a is formed using, for example, silicon oxide or silicon oxynitride.

Then, a polishing stopper layer 160a is formed on the leakage current suppressing layer 150a. The polishing stopper layer 160a may have a different polishing selectivity with the anode cell isolator 130 in a subsequent polishing process. The polishing stopper layer 160a may be formed through a chemical vapor deposition (CVD) process using nitride as a source material.

Then, referring to FIG. 7, the polishing stopper layer 160a, the leakage current suppressing layer 150a, and the first and second metal layers 121a and 123a are patterned to form a cell isolation trench 135. At this time, the polishing stopper layer 160a is transformed into a polishing stopper layer pattern 160b, and the leakage current suppressing layer 150a is transformed into a preliminary leakage current suppressing layer pattern 150b.

A formation region of the cell isolation trench 135 corresponds to a formation region of the anode cell isolator 130. In order to form the trench 135, a reactive ion etching process may be performed.

Referring to FIG. 8, the cell isolation trench 135 is filled with an insulating material to form the anode cell isolator 130. A plurality of array cells may be defined with the anode cell isolator 130 which may serve as a boundary of each cell. Examples of the insulating material include silicon oxide and silicon oxynitride. The anode cell isolator 130 may also be formed through a chemical vapor deposition process using a silicon source material and an oxygen source material.

When the process of forming the anode cell isolator 130 in the trench is performed, a thin layer may be undesirably formed on the polishing stop layer 160a. At this time, since the thin layer is made of silicon oxide or silicon oxynitride, the polishing stopper layer 160a made of silicon nitride may have a polishing selectivity against the thin layer. Thus, when the thin layer is removed through a chemical mechanical polishing process, the polishing stopper layer 160a may function as a polishing stopper in the polishing process. Further, the anode cell isolator 130 may also have a planarized upper surface to have a uniform thickness.

Figure 9:
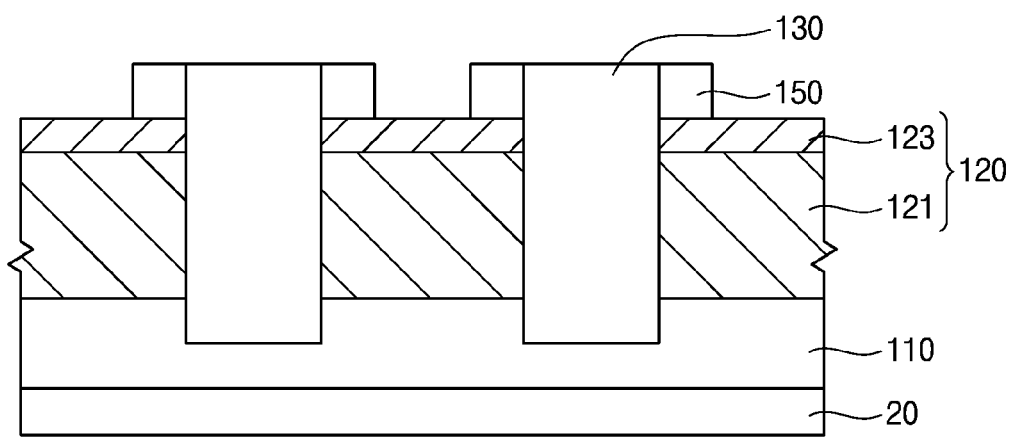

Referring to FIG. 9, the leakage current suppressing layer pattern 150 is formed by patterning the preliminary leakage current suppressing layer pattern 150b. The leakage current suppressing layer pattern 150 may be formed to surround an upper wall of the anode cell isolator 130, which protrudes from the anode structure 120.

Figure 10:
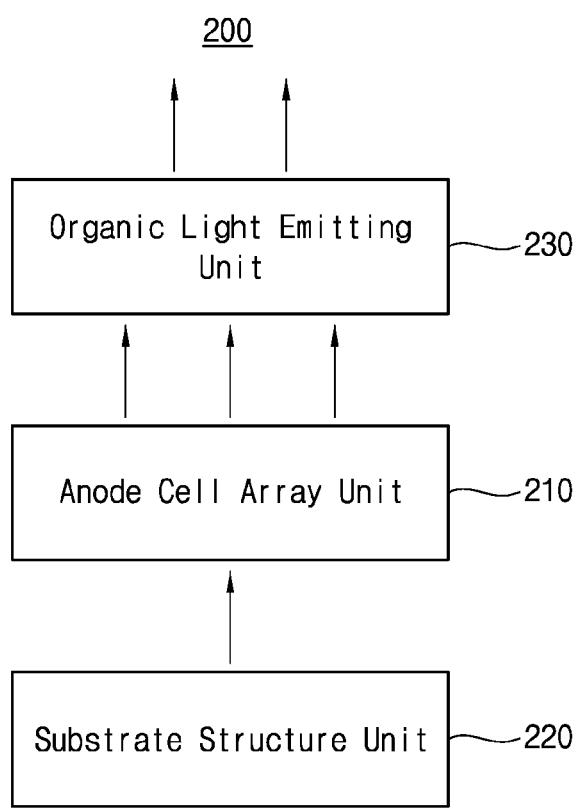
FIG. 10 is a block diagram illustrating an organic light emitting diode (OLED) display device in accordance with an example embodiment of the present disclosure.
Figure 11:
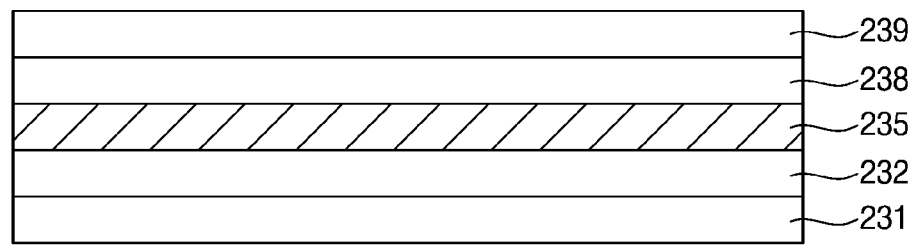
FIG. 11 is a cross sectional view illustrating the organic light emitting unit of FIG. 10.

FIG. 10 is a block diagram illustrating an organic light emitting diode (OLED) display device in accordance with an example embodiment of the present disclosure. FIG. 11 is a cross sectional view illustrating an organic light emitting unit in FIG. 10.

FIGS. 10 and 11, an organic light emitting diode display device 200 according to an example embodiment of the present disclosure includes a substrate structure unit 220, an anode cell array unit 210, and an organic light emitting unit 230.

Since the substrate structure unit 220 and the anode cell array unit 210 have been in detail described with reference to FIGS. 1 to 3, a detailed description thereof will be omitted.

The organic light emitting unit 230 is provided on the anode cell array unit 210. The organic light emitting unit 230 is driven using the anode voltage generated from the anode cell array unit 210.

Referring to FIG. 11, the organic light emitting unit 230 includes an insulating interlayer 231, a hole-transport layer 232, a light emitting layer 235, an electron-transfer layer 238, and a cathode electrode 239.

The holes injected into the anode cell array 210 move to the light emitting layer 235 through the hole-transfer layer 232. Electrons injected from the cathode electrode 239 move to the light emitting layer 235 through the electron-transfer layer 238. Thus, the holes and electrons transferred to the light emitting layer 235 are recombined to emit light.

Although the anode cell array unit and the organic light emitting diode display have been described with reference to the specific embodiments, they are not limited thereto. Therefore, it will be readily understood by those skilled in the art that various modifications and changes may be made thereto without departing from the spirit and scope of the appended claims.

It should be understood that the individual steps used in the methods of the present teachings may be performed in any order and/or simultaneously, as long as the teaching remains operable. Furthermore, it should be understood that the apparatus and methods of the present teachings may include any number, or all, of the described embodiments, as long as the teaching remains operable.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that embodiments may comprise fewer features than illustrated in any individual embodiment described above. The embodiments described herein are not meant to be an exhaustive presentation of the ways in which the various features may be combined. Accordingly, the embodiments are not mutually exclusive combinations of features; rather, embodiments may comprise a combination of different individual features selected from different individual embodiments, as understood by persons of ordinary skill in the art. Moreover, elements described with respect to one embodiment may be implemented in other embodiments even when not described in such embodiments unless otherwise noted. Although a dependent claim may refer in the claims to a specific combination with one or more other claims, other embodiments may also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Moreover, reference in the specification to "one embodiment," "an embodiment," or "some embodiments" means that a particular feature, structure, or characteristic, described in connection with the embodiment, is included in at least one embodiment of the teaching. The appearances of the phrase "in one embodiment" in various places in the specification are not necessarily all referring to the same embodiment.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of Section 112, sixth paragraph of 35 U.S.C. are not to be invoked unless the specific terms "means for" or "step for" are recited in a claim.

What is claimed is:

1. An anode cell array unit for an organic light emitting diode display, the anode cell array unit disposed on a substrate structure unit including an active element for each pixel, and having an organic light emitting unit disposed thereon, the anode cell array unit comprising:
    an insulating interlayer disposed on the substrate structure unit, and configured to be isolated from the active element;
    an anode structure disposed on the insulating interlayer, and electrically connected to the active element;
    an anode cell isolator being arranged to penetrate through the anode structure and to protrude upward from the anode structure, and being configured to define a plurality of cells by isolating the pixels from each other; and
    a leakage current suppressing layer pattern disposed on the anode structure to surround a sidewall of the anode cell isolator and configured to suppress a leakage current that occurs in an area adjacent to an interface between the anode cell isolator and the anode structure.

2. The anode cell array unit of claim 1, wherein the leakage current suppressing layer pattern is configured to make contact with an upper sidewall of the anode cell isolator and a top surface of the anode structure.

3. The anode cell array unit of claim 1, wherein the anode cell isolator and the leakage current suppressing layer pattern define a T-shaped cross section.

4. The anode cell array unit of claim 1, wherein the leakage current suppressing layer pattern comprises silicon oxide.

5. The anode cell array unit of claim 1, wherein the anode structure comprises:
    a first metal layer pattern disposed on the insulating interlayer, and configured to reflect light generated from the organic light emitting unit; and
    a second metal layer pattern disposed on the first metal layer pattern, and comprising a metal having a work function of equal to or greater than about 4.0 eV.

6. The anode cell array unit of claim 5, wherein the first metal layer pattern comprises aluminum-copper alloy, and the second metal layer pattern comprises one of: cobalt nitride or titanium nitride.

7. A method of manufacturing an anode cell array unit for an organic light emitting diode display device, the method comprising:
- forming a substrate structure including an active element for each pixel of a plurality of pixels;
- forming an insulating interlayer on the substrate structure, the insulating interlayer being insulated from the active element;
- forming a preliminary anode structure on the insulating interlayer, the preliminary anode structure being configured to be electrically connected to the active element of each pixel of the plurality of pixels;
- for each pixel of the plurality of pixels, forming an anode cell isolator penetrating the preliminary anode structure to protrude upwardly from the preliminary anode structure, the anode cell isolator being configured to isolate the pixel from the others of the plurality of pixels; and transforming the preliminary anode structure into an anode structure;
- forming a leakage current suppressing layer pattern on the anode structure to cover a sidewall of each anode cell isolator such that a leakage current toward the anode cell isolator is suppressed.

8. The method of claim 7, wherein forming the preliminary anode structure comprises:
- forming a first metal layer on the insulating interlayer for reflecting light generated from the organic light emitting unit; and
- forming a second metal layer on the first metal layer, the second metal layer comprising a metal having a work function of about 4.0 eV or more.

9. The method of claim 8, wherein transforming the preliminary anode structure into the anode structure comprises:
- forming a leakage current suppressing layer on the second metal layer;
- forming a polishing stopper layer on the leakage current suppressing layer;
- patterning the polishing stopper layer, the leakage current suppressing layer the first metal layer and the second metal layer to form a cell isolation trench; and
- filling the cell isolation trench with an insulating material to form an anode cell isolator.

10. The method of claim 9, wherein the leakage current suppressing layer is formed using silicon oxide, and the polishing stopper layer is formed using silicon nitride.

11. The method of claim 9, further comprising removing residue remaining on the polishing stopper layer through a polishing process using the polishing stopper layer as a polishing stopper, after forming the polishing stopper layer.

12. An organic light emitting diode display comprising:
- a substrate structure unit including a substrate and an active element for each of a plurality of pixels disposed on the substrate;
- an anode cell array unit disposed on the substrate structure unit, the anode cell array unit including an insulating interlayer disposed on the substrate structure unit and insulated from the active elements, an anode structure disposed on the insulating interlayer and electrically connected to the active elements, an anode cell isolator for each of the plurality of pixels being arranged to penetrate through the anode structure and to protrude upward from the anode structure, and being configured to define a plurality of cells by isolating the pixels from each other, and a leakage current suppressing layer pattern disposed on the anode structure to surround a sidewall of the anode cell isolator, the leakage current suppressing layer pattern configured to suppress a leakage current in an area adjacent to an interface between the anode cell isolator and the anode structure; and
- an organic light emitting unit disposed on the anode cell array unit and emitting light according to a signal of a signal control unit.

13. The organic light emitting diode display of claim 12, wherein the leakage current suppressing layer pattern is configured to make contact with an upper sidewall of the anode cell isolator and a top surface of the anode structure.

14. The organic light emitting diode display of claim 12, wherein the anode cell isolator and the leakage current suppressing layer pattern define a T-shaped cross section.

15. The organic light emitting diode display of claim 12, wherein the leakage current suppression layer pattern comprises silicon oxide.

* * * * *